United States Patent
Kadura et al.

(10) Patent No.: US 11,888,007 B2
(45) Date of Patent: Jan. 30, 2024

(54) IMAGE SENSOR FORMED IN SEQUENTIAL 3D TECHNOLOGY

(71) Applicant: Commissariat à l'Énergie Atomique et aux Énergies Alternatives, Paris (FR)

(72) Inventors: Lina Kadura, Grenoble (FR); François Andrieu, Grenoble (FR); Perrine Batude, Grenoble (FR); Christophe Licitra, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 284 days.

(21) Appl. No.: 17/017,363

(22) Filed: Sep. 10, 2020

(65) Prior Publication Data

US 2021/0082983 A1    Mar. 18, 2021

(30) Foreign Application Priority Data

Sep. 18, 2019  (FR) ..................... 1910294

(51) Int. Cl.
*H01L 27/146*  (2006.01)

(52) U.S. Cl.
CPC .... *H01L 27/14623* (2013.01); *H01L 27/1469* (2013.01); *H01L 27/14612* (2013.01); *H01L 27/14634* (2013.01); *H01L 27/14636* (2013.01); *H01L 27/14643* (2013.01); *H01L 27/14689* (2013.01)

(58) Field of Classification Search
CPC .......... H01L 27/14623; H01L 27/1469; H01L 27/14634; H01L 27/1464
See application file for complete search history.

(56) References Cited

U.S. PATENT DOCUMENTS

| | | | |
|---|---|---|---|
| 9,059,056 B2* | 6/2015 | Kondo | H04N 25/79 |
| 9,136,304 B2* | 9/2015 | Maeda | H01L 23/481 |
| 9,245,912 B2* | 1/2016 | Kao | H01L 27/14634 |
| 2012/0105696 A1* | 5/2012 | Maeda | H01L 27/1469 |
| | | | 438/66 |
| 2018/0227549 A1 | 8/2018 | Cai et al. | |
| 2019/0252442 A1* | 8/2019 | Tanaka | H01L 27/14623 |
| 2022/0013568 A1* | 1/2022 | Hayashi | H01L 27/14625 |
| 2022/0246666 A1* | 8/2022 | Kunitake | H01L 27/14643 |

OTHER PUBLICATIONS

Preliminary Search Report for French Application No. 1910294, dated May 6, 2020.

* cited by examiner

Primary Examiner — David A Zarneke
(74) Attorney, Agent, or Firm — Wolf, Greenfield & Sacks, P.C.

(57) ABSTRACT

An image sensor including a plurality of pixels, each pixel including a photodetector coupled to a control circuit, the photodetector being formed inside and on top of a first semiconductor substrate, and the control circuit including at least one first MOS transistor formed inside and on top of a second semiconductor substrate arranged on the first substrate, the sensor being intended to be illuminated on the side of the surface of the first substrate opposite to the second substrate, the sensor further comprising a shield arranged between the first and second substrates and extending over substantially the entire surface of the sensor, said shield including at least one electrically-conductive layer.

15 Claims, 2 Drawing Sheets

IMAGE SENSOR FORMED IN SEQUENTIAL 3D TECHNOLOGY

This application claims the priority benefit of French patent application number FR No°19/10294, the content of which is hereby incorporated by reference in its entirety to the maximum extent allowable by law.

TECHNICAL BACKGROUND

The present disclosure concerns the field of image sensors. It more particularly aims at image sensors formed in sequential 3D technology.

PRIOR ART

An image sensor conventionally comprises a plurality of pixels, for example, arranged in an array of rows and columns, each pixel comprising a photodetector coupled to a control circuit comprising one or a plurality of transistors.

To increase the integration surface density of pixels while keeping a significant photodetection surface area per pixel and thus a high sensitivity, it has been provided to form image sensors on two stacked semiconductor levels. As an example, patent application US2007/0018075 describes a sensor where, in each pixel, the photodiode and a transfer transistor of the control circuit are formed inside and on top of a first semiconductor substrate, the other transistors of the control circuit being formed inside and on top of a second semiconductor substrate stacked to the first substrate. The sensor is intended to be illuminated on the side of the surface of the first substrate opposite to the second substrate.

In patent application US2007/0018075, it is more particularly provided to first form the photodiodes and the transfer transistors inside and on top of the first semiconductor substrate, to then deposit the second substrate on the first substrate, and then only to form the other transistors of the control circuit inside and on top of the second substrate. The connections between the first substrate and the second substrate are formed by means of conductive vias crossing the entire thickness of the second substrate, formed from the upper surface of the second substrate after the transfer of the second substrate onto the first substrate.

Such a manufacturing technology is called sequential 3D technology ("3D" for three dimensions since the sensor is formed on a plurality of semiconductor levels, and "sequential" because the components of the upper semiconductor substrate and the interconnections between the upper substrate and the lower substrate are formed only after having formed the components of the lower semiconductor substrate and transferred the upper substrate onto the lower substrate).

Sequential 3D technology enables to limit the alignment accuracy required during the transfer of the second substrate onto the first substrate since, on transfer of the second substrate onto the first substrate, no component or pattern has been formed yet inside or on top of the first substrate. Further, it enables to limit the surface area occupied by the elements of connection between the upper substrate and the lower substrate.

It would be desirable to overcome all or part of the disadvantages of known image sensors formed in sequential 3D technology.

SUMMARY

For this purpose, an embodiment provides an image sensor comprising a plurality of pixels, each pixel comprising a photodetector coupled to a control circuit, the photodetector being formed inside and on top of a first semiconductor substrate, and the control circuit including at least one first MOS transistor formed inside and on top of a second semiconductor substrate arranged on the first substrate, the sensor being intended to be illuminated on the side of the surface of the first substrate opposite to the second substrate, the sensor further comprising a shield arranged between the first and second substrates and extending over substantially the entire surface of the sensor, said shield comprising at least one electrically-conductive layer.

According to an embodiment, said at least one electrically-conductive layer of the shield is made of a metal or of a doped semiconductor material.

According to an embodiment, said at least one electrically-conductive layer of the shield is made of a germanium-containing semiconductor material.

According to an embodiment, said at least one electrically-conductive layer of the shield is made of a germanium-tellurium alloy.

According to an embodiment, said at least one electrically-conductive layer of the shield is made of a metal from the group comprising tungsten, aluminum, and titanium nitride.

According to an embodiment, the shield is absorbing in a detection wavelength range of the sensor.

According to an embodiment, the shield comprises an alternation of silicon oxide layers and of doped silicon layers forming a Bragg mirror reflecting the light transmitted by the first substrate at the detection wavelengths of the sensor.

According to an embodiment, the first and second substrates are made of silicon.

According to an embodiment, the shield is separated from the second substrate by an insulating layer.

According to an embodiment, said at least one conductive layer of the shield is connected to a node of application of a bias potential via a conductive via crossing the second substrate.

According to an embodiment, said at least one first MOS transistor is coupled to the photodetector via a conductive via crossing the second substrate and the shield.

According to an embodiment, said conductive via has a diameter smaller than or equal to 90 nm.

According to an embodiment, the control circuit comprises at least one second MOS transistor formed inside and on top of the first substrate, and the gate of said at least one second MOS transistor is arranged on the side of a surface of the first substrate facing the second substrate, the gate of said at least one second transistor being arranged on the side of a surface of the second substrate opposite to the first substrate.

According to an embodiment, the distance between the first and second substrates is shorter than or equal to 750 nm.

According to an embodiment, the sensor comprises no metal interconnection tracks parallel to the first and second substrates between the first substrate and the shield.

Another embodiment provides a method of manufacturing an image sensor comprising a plurality of pixels, each pixel comprising a photodetector coupled to a control circuit, the photodetector being formed inside and on top of a first semiconductor substrate, and the control circuit comprising at least one first MOS transistor formed inside and on top of a second semiconductor substrate arranged on the first substrate, the sensor being intended to be illuminated on the side of the surface of the first substrate opposite to the second substrate, the sensor further comprising a shield arranged between the first and second substrates and extending over substantially the entire surface of the sensor, said shield comprising at least one electrically-conductive layer, the method comprising the successive steps of:

forming the photodetector in the first substrate;

depositing the shield on the first substrate or on the second substrate;

transferring the second substrate onto the first substrate so that the shield is arranged between the first and second substrates; and forming said at least one first MOS transistor inside and on top of the second substrate, on the side of a surface of the second substrate opposite to the shield.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
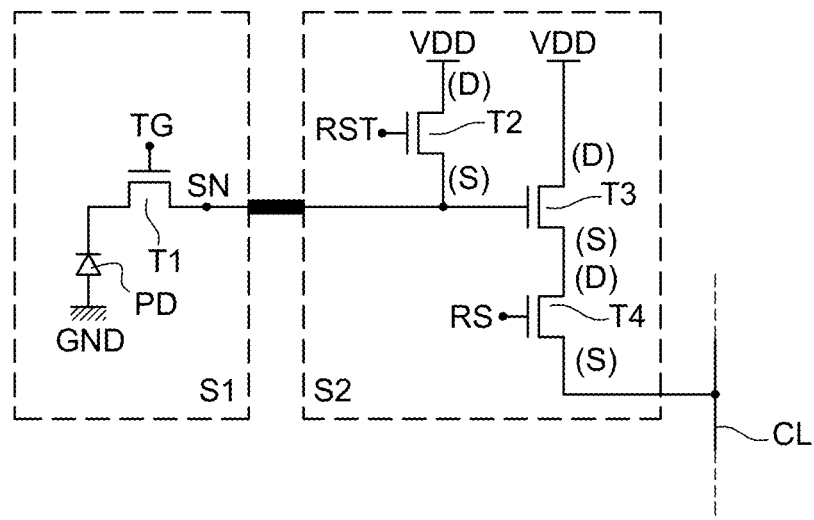
FIG. 1 is an electric diagram of an example of a pixel of an image sensor according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, in the embodiments of image sensors in sequential 3D technology described hereafter, the various steps of forming of the pixel elements of the first and second semiconductor substrates have not been detailed, the implementation of these steps being within the abilities of those skilled in the art based on the indications of the present disclosure.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

Unless specified otherwise, the expressions "around", "approximately", "substantially" and "in the order of" signify within 10%, and preferably within 5%.

A problem which is posed in an image sensor of the type described in above-mentioned patent application US2007/0018075 is that the accumulation of photogenerated charges in the photodetector of the first substrate during a pixel integration phase may result, by electrostatic effect, in modifying the threshold voltage of the transistors of the second substrate, which may generate unwanted artifacts in the image acquired by the sensor. More generally, any modification of the biasing of a conductive or semiconductor region of a component of the first substrate may result in modifying the threshold voltage of the transistors of the second substrate, which is not desirable.

Further, photons are likely to cross the first substrate and to penetrate into the second substrate, which may generate leakage currents in the transistors of the second substrate, here again resulting in artifacts in the images acquired by the sensor.

According to an aspect of an embodiment, it is provided to arrange an opaque shield between the first and second substrates, the shield extending over substantially the entire surface of the sensor and comprising at least one electrically-conductive layer. The opaque shield enables to block or to limit the parasitic transmission of photons from the first substrate to the second substrate. The conductive layer of the opaque shield forms an electrostatic shield between the first and second substrates, which enables to avoid for the photogenerated charges accumulated in the first substrate to modify the threshold voltage of the transistors of the second substrate.

FIG. 1 is an electric diagram of an example of a pixel of an image sensor according to an embodiment.

The pixel of FIG. 1 comprises a photodetector PD coupled to a capacitive sense node SN of the pixel via a transfer transistor T1. In this example, photodetector PD is a photodiode having its anode coupled, for example, connected to a node GND of application of a reference potential, for example, the ground, and having its cathode coupled to node SN via transistor T1. More particularly, in the present example, transistor T1 is an N-channel MOS transistor having a first conduction node (source or drain) connected to the cathode of photodiode PD and a second conduction node (drain or source) connected to node SN.

In the example of FIG. 1, the pixel further comprises a reset MOS transistor T2 coupling, by its conduction nodes (source and drain), sense node SN to a node of application of a high power supply potential VDD of the pixel, for example, common to all the sensor pixels. In the shown example, transistor T2 is an N-channel MOS transistor having its source (S) coupled, preferably connected, to node SN and having its drain (D) coupled, preferably connected, to node VDD. The pixel further comprises a readout MOS transistor T3 assembled as a follower source, having its gate coupled, preferably connected, to node SN. In the shown example, transistor T3 is an N-channel MOS transistor having its drain (D) coupled, preferably connected, to node VDD. The pixel further comprises a readout selection MOS transistor T4 coupling, by its conduction nodes, the source (S) of readout transistor T3 to an output conductive track CL of the pixel, which may be common to a plurality of pixels of the sensor. In the shown example, transistor T4 is an N-channel MOS transistor having its drain (D) coupled, preferably connected, to the source (S) of transistor T3 and having its source (S) coupled, preferably connected, to output conductive track CL.

Transistors T1, T2, T3, and T4 form the pixel control circuit. In operation, the potential variations of sense node SN are transferred to the source of transistor T3. The pixel receives control signals TG, RST, and RS respectively applied to the gates of transistors T1, T2, and T4.

As an example, the pixels are arranged in an array, the pixels of a same column sharing a same output conductive track CL and the pixels of different columns being coupled to different output conductive tracks CL. On acquisition of an image, the pixels are for example initialized, and then integrate the incident light flow before being read row by row. For this purpose, in each row of pixels of the sensor, the gates of the transfer transistors T1 of the pixels in the row may be connected to a same conductive track (not shown) receiving a control signal TG common to all the pixels in the row, the gates of the reset transistors T2 of the pixels in the row may be connected to a same conductive track (not shown) receiving a control signal RST common to all the pixels in the row, and the gates of the transistors T4 of the pixels in the row may be connected to a same conductive track (not shown) receiving a control signal RS common to all the pixels in the row.

As schematically illustrated in FIG. 1 by frames in dashed lines, photodiode PD and transfer transistor T1 are formed inside and on top of a first semiconductor substrate S1, and transistors T2, T3, and T4 are formed inside and on top of a second semiconductor substrate S2, arranged on substrate S1. FIG. 1 further shows, in the form of a thick line, an insulated conductive via crossing substrate S2 and connecting the source of transistor T2 and the gate of transistor T3 to the sense node SN located on substrate S1.

Figure 2:
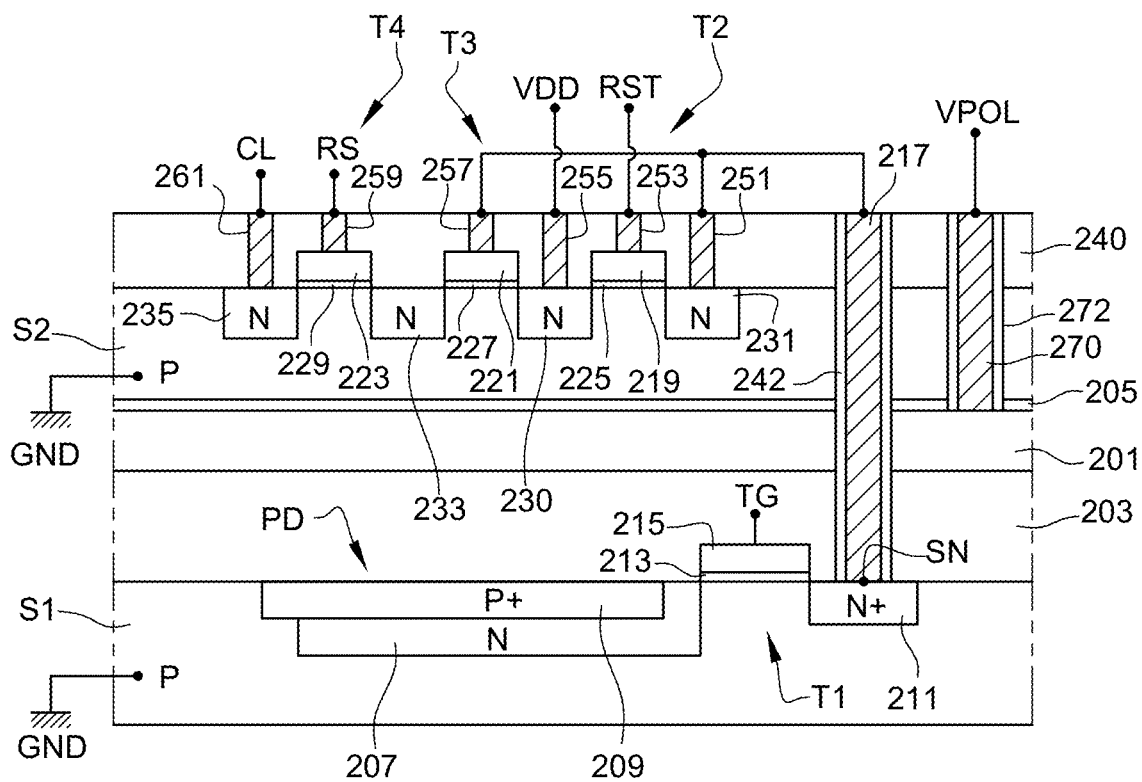
FIG. 2 is a cross-section view schematically illustrating an embodiment of the pixel of FIG. 1.

FIG. 2 is a cross-section view schematically illustrating an embodiment of the pixel of FIG. 1.

In this example, the sensor comprises a lower semiconductor substrate S1 and an upper semiconductor substrate S2, separated from each other by an opaque shield 201 extending over substantially the entire surface of the sensor. In this example, shield 201 is a conductive layer, for example, made of a doped semiconductor material or of a metal, and thus forms an electrostatic shield between substrates S1 and S2. As an example, shield 201 is made of germanium, of a germanium-tellurium alloy, of tungsten, of titanium nitride, or of aluminum. As a variant, shield 201 is made of polysilicon, for example, of doped polysilicon.

The sensor further comprises an electrically-insulating layer 203 separating substrate S1 from shield layer 201, and an insulating layer 205 separating shield layer 201 from substrate S2. As an example, insulating layer 203 is arranged on top of and in contact with the upper surface of substrate S1, shield layer 201 is arranged on top of and in contact with the upper layer of insulating layer 203, insulating layer 205 is arranged on top of and in contact with the upper surface of shield layer 201, and substrate S2 is arranged on top of and in contact with the upper surface of insulating layer 205.

Substrates S1 and S2 are for example made of single-crystal silicon. In this example, substrates S1 and S2 are P-type doped. Substrates S1 and S2 are for example intended to be coupled to a node of application of a low power supply potential GND of the sensor, for example, the ground. Insulating layers 203, and 205, are for example made of silicon oxide.

In each pixel, photodiode PD and transfer transistor T1 are formed inside and on top of a portion of substrate S1, the transistors T2, T3, and T4 of the pixel being formed inside and on top of a portion of substrate S2, located opposite (that is, vertically aligned with) the corresponding portion of substrate S1.

In the shown example, photodiode PD comprises an N-type doped well 207 formed in substrate S1, on its upper surface side, for example, by implantation. In this example, well 207 extends vertically from the upper surface of substrate S1 down to an intermediate depth of substrate S1. In top view (not shown), well 207 extends over the most part of the pixel surface. Well 207 forms the cathode region of photodiode PD and defines a region of accumulation of photogenerated charges of the pixel. Photodiode PD further comprises a P-type doped layer 209, having a doping level greater than that of substrate S1, formed in well 207 on its upper surface side, for example, by implantation. In this example, layer 209 extends vertically from the upper surface of substrate S1 down to a depth smaller than the depth of well 207. In top view (not shown), layer 209 extends over the most part of the surface of well 207. Laterally, layer 209 extends beyond the edges of well 207 and comes into contact with substrate S1 on a portion of the periphery of well 207 (in the left-hand portion in the representation of FIG. 2). On another portion of the periphery of well 207 (right-hand portion in the representation of FIG. 2), layer 209 does not extend all the way to the edge of well 107. Layer 209 forms the anode region of photodiode PD.

The pixel of FIG. 2 further comprises, on the side of an edge of well 207 which is not covered with layer 209 (right-hand edge in the representation of FIG. 2), an N-type doped readout region 211, formed in substrate S1, for example, by implantation. Readout region 211 extends vertically from the upper surface of substrate S1 down to an intermediate depth of substrate S1, for example, down to a depth smaller than that of well 207. Readout region 211 is laterally separated from well 207 by a portion of substrate S1. The doping level of readout region 211 is for example heavier than that of well 207. In this example, well 207 and readout region 211 respectively form the source region and the drain region of transistor T1. The substrate portion separating readout region 211 from well 207 forms a channel-forming region of transistor T1. Transistor T1 further comprises an insulated gate stack extending above the channel-forming region of the transistor. More particularly, in the shown example, the gate stack of transistor T1 comprises an insulating layer 213, for example, made of silicon oxide, arranged on top of and in contact with the upper surface of the P-type substrate portion separating region 211 from well 207, and a conductive layer 215, for example, made of doped polysilicon, arranged on top of and in contact with the upper surface of insulating layer 213.

Readout region 211 is in contact, by its upper surface, with a conductive metal via 217 crossing the entire thickness of substrate S2, of insulating layer 205, of shield 201, and of insulating layer 203.

In the example of FIG. 2, insulating layer 203, shield layer 201, and insulating layer 205 are deposited on the upper surface of substrate S1 after the forming of photodiode PD and of transistor T1 inside and on top of substrate S1. Before the transfer of substrate S2, each of layers 203, 201, and 205 for example continuously extends over the entire surface of substrate S1.

Upper substrate S2 is then transferred, for example, by molecular bonding, onto the upper surface of insulating layer 205, after which transistors T2, T3, and T4 are formed inside and on top of substrate S2, on the upper surface side of substrate S2.

As a variant, insulating layer 205 and shield layer 201 may be deposited on the lower surface of substrate S2, the assembly comprising substrate S2, insulating layer 205, and shield layer 201 then being placed on the upper surface of layer 203.

As an example, before the transfer of substrate S2 onto substrate S1, through openings may be formed in shield layer 201 and then filled with an insulating material, for example for the passage of conductive connection vias 217.

Transistors T2, T3, and T4 each comprise a conductive gate 219, respectively 221, respectively 223, for example, made of polysilicon, arranged above substrate S2 and insulated therefrom by a dielectric layer 225, respectively 227, respectively 229. N-type doped source/drain regions are formed in the upper portion of substrate S2, on either side of the transistor gates 219, 221, 223. More particularly, an N-type region 230 common to transistors T2 and T3, extending between gate 219 of transistor T2 and gate 221 of transistor T3, forms the drain of transistor T2 and the drain of transistor T3. An N-type region 231 arranged on the side of gate 219 opposite to region 230 defines the source region transistor T2. An N-type region 233 common to transistors T3 and T4, extending between gate 221 of transistor T3 and gate 223 of transistor T4, forms the source of transistor T3 and the drain of transistor T4. An N-type region 235 arranged on the side of gate 223 opposite to region 233 defines the source region of transistor T4.

In the shown example, an insulating layer 240, for example, made of silicon oxide, is deposited on the upper surface of substrate S2 after the forming of transistors T2, T3, and T4.

Conductive 217 is formed after the deposition of insulating layer 240, in a vertical opening formed from the upper surface of insulating layer 240 and emerging onto the upper surface of readout region 211. An insulating layer 242, for example, made of silicon oxide, coats the lateral walls of the opening to electrically insulate via 217 from substrate S2 and from shield 201.

As a variant, before the transfer of substrate S2 onto substrate S1, through openings may be formed in shield layer 201 and then filled with an insulating material, for the passage of conductive via 217. Further, after the transfer of substrate S2 onto substrate S1 and before the forming of insulating layer 240, through openings may be formed in substrate S2 and then filled with an insulating material (for example, the material of insulating layer 240) for the passage of conductive via 217. This enables to only have to etch insulating materials for the forming of conductive vias 217. Layer 242 is for example a PMD-type ("Pre-Metal Dielectric") dielectric layer.

Gate 215 of transistor T1 is connected to a node of application of the sensor control signal TG, for example, via an insulated conductive metal via, not shown, electrically coupling gate 215 of transistor T1 to the upper surface of layer 240. The via may be formed after the deposition of insulating layer 240, in a vertical opening formed from the upper surface of insulating layer 240 and emerging onto the upper surface of gate 215.

In the shown example, metallization or conductive vias 251, 253, 255, 257, 259, and 261 formed in insulating layer 240 respectively couple the source region 231 of transistor T2, the gate 219 of transistor T2, the drain region 230 of transistor T2, the gate 229 of transistor T3, the gate of transistor T4, and the source region 235 of transistor T4 to the upper surface of insulating layer 240.

Metallizations 251 and 257 are connected to metallization 217 by one or a plurality of metal tracks, not detailed, arranged on the upper surface of insulating layer 240. Metallization 253 is connected to a node of application of the control signal RST of transistor T2. Metallization 255 is connected to a node of application of potential VDD. Metallization 259 is connected to a node of application of the control signal RS of transistor T4. Metallization 261 is connected to the output conductive track CL of the pixel.

Preferably, no metallization is formed in insulating layer 203 before the transfer of substrate S2. Indeed, the forming of metallizations in insulating layer 203 before the transfer of substrate S2 would result in significantly restricting the thermal budget available for the forming of the pixel elements formed inside and on top of substrate S2. Further, this would cause a risk of contamination with metal of the equipment used for the forming of the pixel elements formed inside and on top of substrate S2.

For the same reasons, shield 201 is preferably made of a doped semiconductor material (that is, non metallic). Preferably, the doping level of layer 201 is then relatively heavy, for example greater than $10^{19}$ atoms/cm$^3$, to obtain a high electric conductivity enabling to obtain the desired electrostatic shield effect. In a preferred embodiment, shield 201 is made of a germanium-containing semiconductor material, for example, made of germanium, and preferably of a germanium-tellurium (GeTe) alloy.

An advantage of GeTe is that it is relatively absorbing for visible wavelengths, and has a transmittance peak in near infrared. This enables, at visible wavelengths, corresponding in the present example to the detection wavelengths of the sensor, to obtain the desired effect of blocking of the parasitic light transmitted by substrate S1 towards substrate S2. Further, this enables, on forming of the components of upper substrate S2, to align on marks previously formed on lower substrate S1 by using an alignment tool operating in near infrared. In other words, the alignment is formed by transparency through layer 201, without having to previously disengage the alignment marks formed on substrate S1. The GeTe layer forming shield 201 may be amorphous or crystalline. In the second case, a crystallization anneal, for example, at a temperature in the order of 400° C., is provided after the deposition of the layer, for example, before the transfer of substrate S2. An advantage of crystalline GeTe is that it is more absorbing than amorphous GeTe in the visible range, and has a narrower transmittance peak in near infrared, typically a peak centered on a wavelength in the range from 1,400 to 1,700 nm.

As a variant, if the material of layer 201 is not sufficiently transparent to the wavelengths used by the alignment tool, for example, if layer 201 is metallic, layer 201 may be locally removed, for example, by etching, opposite the alignment marks formed on substrate S1.

More generally, shield 201 is preferably absorbing to the wavelengths to be detected so as to limit the crosstalk between neighboring pixels.

Layer 201 for example has a thickness in the range from 20 to 500 nm, for example, in the order of 100 nm.

Due to its electric conductivity, layer 201 has an electrostatic barrier effect enabling to avoid or to limit parasitic variations of the threshold voltage of transistors T2, T3, and T4 under the effect of potential variations of the accumulation region 207 of photodiode PD.

Layer 201 may be left floating, or may be biased to control the threshold voltage of transistors T2, T3, and T4. In this last case, the sensor may further comprise one or a plurality of conductive vias 270 coupling the upper surface of layer 201 to the upper surface of insulating layer 240. Conductive via 270 may be connected, by its upper surface, to a node of application of a bias potential VPOL of shield layer 201. In the shown example, conductive via 270 is insulated from substrate S2 by a lateral insulation layer 272, for example, made of silicon oxide. In this configuration, the insulating layer 205 separating shield 201 from substrate S2 is preferably relatively thin, for example, with a thickness in the range from 10 to 100 nm, to ease the adjustment of the threshold voltage of transistors T2, T3, and T4 by electrostatic effect.

The sensor described in relation with FIG. 2 is intended to be illuminated on the side of the surface of substrate S1 opposite to substrate S2. Substrate S1 is thus preferably relatively thin, to enable the photogenerated charges to reach photodiode PD. A step of thinning of substrate S1, from its lower surface, is for example provided after the forming of transistors T2, T3, and T4 in upper substrate S2. As an example, after the thinning, the thickness of substrate S1 is in the range from 3 to 10 micrometers.

Additional layers (not shown) having electric passivation functions and/or optical functions, for example, antireflection functions, may be deposited on the lower surface of substrate S1.

It should be noted that various structural characteristics result from the sequential forming of the 3D assembly forming the sensor of FIG. 2, and differentiate this assembly from a parallel 3D assembly, that is, an assembly of two integrated circuits formed separately from each other, and then placed against each other and connected to each other via their respective metallizations.

It can in particular be noted that in the sensor of FIG. 2, the distance separating the upper surface of substrate S1 from the lower surface of substrate S2, corresponding in the shown example to the cumulated thickness of layers 203, 201, and 205, may be relatively short, for example, shorter than or equal to 750 nm, for example, in the order of 500 nm.

As a result, the conductive vias formed after the transfer of substrate S2 and crossing substrate S2 to connect components of substrate S2 to components of substrate S1, for example, via 217, may have relatively small transverse dimensions, for example, a diameter smaller than or equal to 90 nm, which enables to reach a high integration density.

It should further be noted that the vias directly emerge either onto the upper surface of substrate S1, as particularly occurs for via 217, or onto the upper surface of conductive gates 215.

Preferably, gate 215 is made of polysilicon and no metallization is formed above the upper surface of substrate S1 before the deposition of shield 201. As a result, there exists no line or no metal interconnection pad parallel to substrates S1 and S2 extending between substrate S1 and shield 201. It should be noted that in the present example, no line or metal interconnection pad parallel to substrates S1 and S2 extending between shield 201 and the transistors exists either, which enables to obtain the desired effect of control of the transistor threshold voltage.

It can further be noted that in the sensor of FIG. 2, the transistors of substrate S1 and the transistors of substrate S2 have the same orientation. In particular, the channel-forming region of transistor T1 is located on the lower surface side of gate 215 of transistor T1. Similarly, transistors T2, T3, and T4 have their respective channel-forming regions located on the lower surface side of their respective gates 219, 221, and 223.

Figure 3:
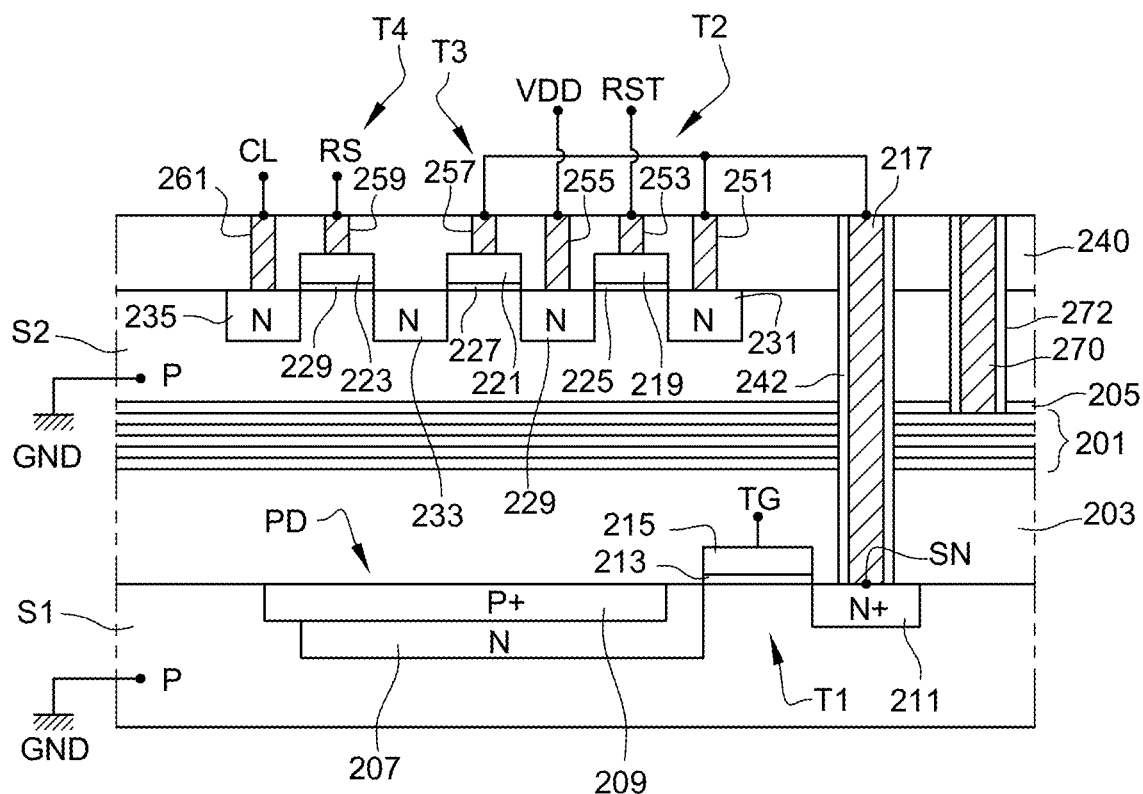
FIG. 3 is a cross-section view schematically illustrating another embodiment of the pixel of FIG. 1.

FIG. 3 illustrates an alternative embodiment of the pixel of FIG. 2.

The pixel of FIG. 3 differs from the pixel of FIG. 2 mainly in that, in the pixel of FIG. 3, shield 201 is not formed by a single conductive layer, but by a stack of a plurality of layers having different refraction indices forming a Bragg mirror reflecting the parasitic light transmitted by substrate S1 towards substrate S2. Among the layers of the Bragg mirror, at least one layer is a doped semiconductor layer, for example, a doped silicon layer, for example, having a doping level greater than $10^{19}$ atoms/cm$^3$, ensuring the desired electrostatic shield function between substrates S1 and S2. As an example, shield 201 comprises an alternation of silicon oxide layers and of doped silicon layers.

The above-described embodiments are particularly advantageous in the case of a so-called global shutter sensor, where each pixel comprises, in substrate S1, a memory area enabling to temporarily store a signal acquired during an integration phase, while waiting for its reading by a circuit external to the pixel. Shield 201 then enables to prevent possible distortions of the stored signal due to parasitic variations of the behavior of the transistors formed in substrate S2. The described embodiments are however not limited to this specific case and can more generally apply to any image sensor formed in sequential 3D technology.

Various embodiments and variants have been described. It will be understood by those skilled in the art that certain features of these various embodiments and variations may be combined, and other variations will occur to those skilled in the art. In particular, the described embodiments are not limited to the examples of materials and of dimensions mentioned in the present disclosure. Further, the described embodiments are not limited to the specific case described hereabove, where the photodetector PD of each pixel is a photodiode. More generally, the described embodiments apply whatever the type of photodetector used. Further, the described embodiments are not limited to the specific example of control circuit described hereabove.

Further, although embodiments where the sensor comprises one control circuit (transistors T1, T2, T3, and T4) per pixel have been described, the described embodiments are not limited to this specific case. As a variant, a same control circuit may be shared by a plurality of adjacent pixels (that is, common to a plurality of adjacent pixels), for example, a group of two or four adjacent pixels.

Further, although this has not been detailed, the described sensors may comprise a third substrate (not shown) placed against the second substrate on the side of the surface of the second substrate opposite to the first substrate. The third substrate may in particular integrate circuits for driving the pixel array integrated in the first and second substrates.

Finally, the practical implementation of the embodiments and variants described herein is within the capabilities of those skilled in the art based on the functional indications provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising a plurality of pixels, each pixel comprising a photodetector and a control circuit for controlling the photodetector, the photodetector being formed inside and on top of a first semiconductor substrate, and the control circuit comprising at least one first MOS transistor formed inside and on top of a second semiconductor substrate arranged on the first semiconductor substrate, the image sensor being intended to be illuminated on the side of the surface of the first semiconductor substrate opposite to the second semiconductor substrate, the image sensor further comprising a shield arranged between the first and second semiconductor substrates and extending over substantially the entire surface of the image sensor, said shield comprising at least one electrically-conductive layer, wherein the control circuit comprises at least one second MOS transistor formed inside and on top of the first semiconductor substrate, and wherein the gate of said at least one second MOS transistor is arranged on the side of a surface of the first semiconductor substrate facing the second semiconductor substrate, the gate of said at least one first MOS transistor being arranged on the side of a surface of the second semiconductor substrate opposite to the first semiconductor substrate, wherein said at least one conductive layer of the shield is connected to a node of application of a bias potential via a conductive via crossing the second semiconductor substrate.

2. The image sensor according to claim 1, wherein said at least one electrically-conductive layer of the shield is made of metal or of a doped semiconductor material.

3. The image sensor according to claim 2, wherein said at least one electrically-conductive layer of the shield is made of a germanium-containing semiconductor material.

4. The image sensor according to claim 3, wherein said at least one electrically-conductive layer of the shield is made of a germanium-tellurium alloy.

5. The image sensor according to claim 2, wherein said at least one electrically-conductive layer of the shield is made of a metal from the group comprising tungsten, aluminum, and titanium nitride.

6. The image sensor according to claim 1, wherein the shield is absorbing in a detection wavelength range of the image sensor.

7. The image sensor according to claim 1, wherein the shield comprises an alternation of silicon oxide layers and of doped silicon layers forming a Bragg mirror reflecting the light transmitted by the first semiconductor substrate at the detection wavelengths of the image sensor.

8. The image sensor according to claim 1, wherein the first and second semiconductor substrates are made of silicon.

9. The image sensor according to claim 1, wherein the shield is separated from the second semiconductor substrate by an insulating layer.

10. The image sensor according to claim 1, wherein each pixel comprises a conductive via crossing the second semiconductor substrate and the shield, said via coupling the photodetector to said at least one first MOS transistor.

11. The image sensor according to claim 10, wherein said conductive via has a diameter smaller than or equal to 90 nm.

12. The image sensor of claim 1, wherein the distance between the first and second semiconductor substrates is shorter than or equal to 750 nm.

13. The image sensor according to claim 1, comprising no metal interconnection tracks parallel to the first and second semiconductor substrates between the first semiconductor substrate and the shield.

14. The image sensor according to claim 1, wherein the pixels of said plurality of pixels are arranged in an array.

15. A method of manufacturing an image sensor comprising a plurality of pixels, each pixel comprising a photodetector and a control circuit for controlling the photodetector, the photodetector being formed inside and on top of a first semiconductor substrate, and the control circuit comprising at least one first MOS transistor formed inside and on top of a second semiconductor substrate arranged on the first semiconductor substrate, the image sensor being intended to be illuminated on the side of the surface of the first semiconductor substrate opposite to the second semiconductor substrate, the image sensor further comprising a shield arranged between the first and second semiconductor substrates and extending over substantially the entire surface of the image sensor, said shield comprising at least one electrically-conductive layer, the method comprising the successive steps of:

forming the photodetector in the first semiconductor substrate;

depositing the shield on the first semiconductor substrate or on the second semiconductor substrate;

transferring the second semiconductor substrate onto the first semiconductor substrate so that the screen is arranged between the first and second semiconductor substrates; and forming said at least one first MOS transistor inside and on top of the second semiconductor substrate, on the side of a surface of the second semiconductor substrate opposite to the shield, wherein the control circuit comprises at least one second MOS transistor formed inside and on top of the first semiconductor substrate, and wherein the gate of said at least one second MOS transistor is arranged on the side of a surface of the first semiconductor substrate facing the second semiconductor substrate, the gate of said at least one first MOS transistor being arranged on the side of a surface of the second semiconductor substrate opposite to the first semiconductor substrate, wherein said at least one conductive layer of the shield is connected to a node of application of a bias potential via a conductive via crossing the second semiconductor substrate.

* * * * *